United States Patent [19]
Luebs

[11] Patent Number: 5,117,133
[45] Date of Patent: May 26, 1992

[54] HASHING OUTPUT EXCLUSIVE-OR DRIVER WITH PRECHARGE

[75] Inventor: Richard J. Luebs, Fort Collins, Colo.

[73] Assignee: Hewlett-Packard Co., Palo Alto, Calif.

[21] Appl. No.: 629,291

[22] Filed: Dec. 18, 1990

[51] Int. Cl.$^5$ ............ H03K 19/21; H03K 19/20
[52] U.S. Cl. .................. 307/471; 307/451; 307/452
[58] Field of Search ............ 307/471, 451, 452

[56] References Cited

U.S. PATENT DOCUMENTS

| | | | |
|---|---|---|---|
| 4,342,927 | 8/1982 | Hull | 307/452 |
| 4,562,365 | 12/1985 | Redfield | 307/471 |
| 4,575,648 | 3/1986 | Lee | 307/451 |
| 4,646,306 | 2/1987 | Davis et al. | 307/471 |
| 4,808,855 | 2/1989 | Lloyd | 307/471 |
| 4,831,285 | 5/1989 | Gaiser | 307/471 |
| 4,974,241 | 11/1990 | McClure et al. | 307/471 |

Primary Examiner—David Hudspeth
Assistant Examiner—Andrew Sanders

[57] ABSTRACT

A circuit which performs a hashing (exclusive OR) function and has a high drive output for driving large capacitive loads. The invention incorporates a hashing function into an output driver, such as address driver, by incorporating a pull-down circuit into the output driver which is responsive to the respective inputs to be hashed together. A very short setup time for the inputs and a very fast evaluation of the hashing function is made possible in accordance with the invention by precharging the pull-down circuit before the inputs are received. The pull-down circuit is arranged such that a high output is outputted only when both of the input signals in a discharge path are of the same logic level. The resulting system is not limited by slow evaluation of the hashing function and thus has improved performance.

2 Claims, 2 Drawing Sheets

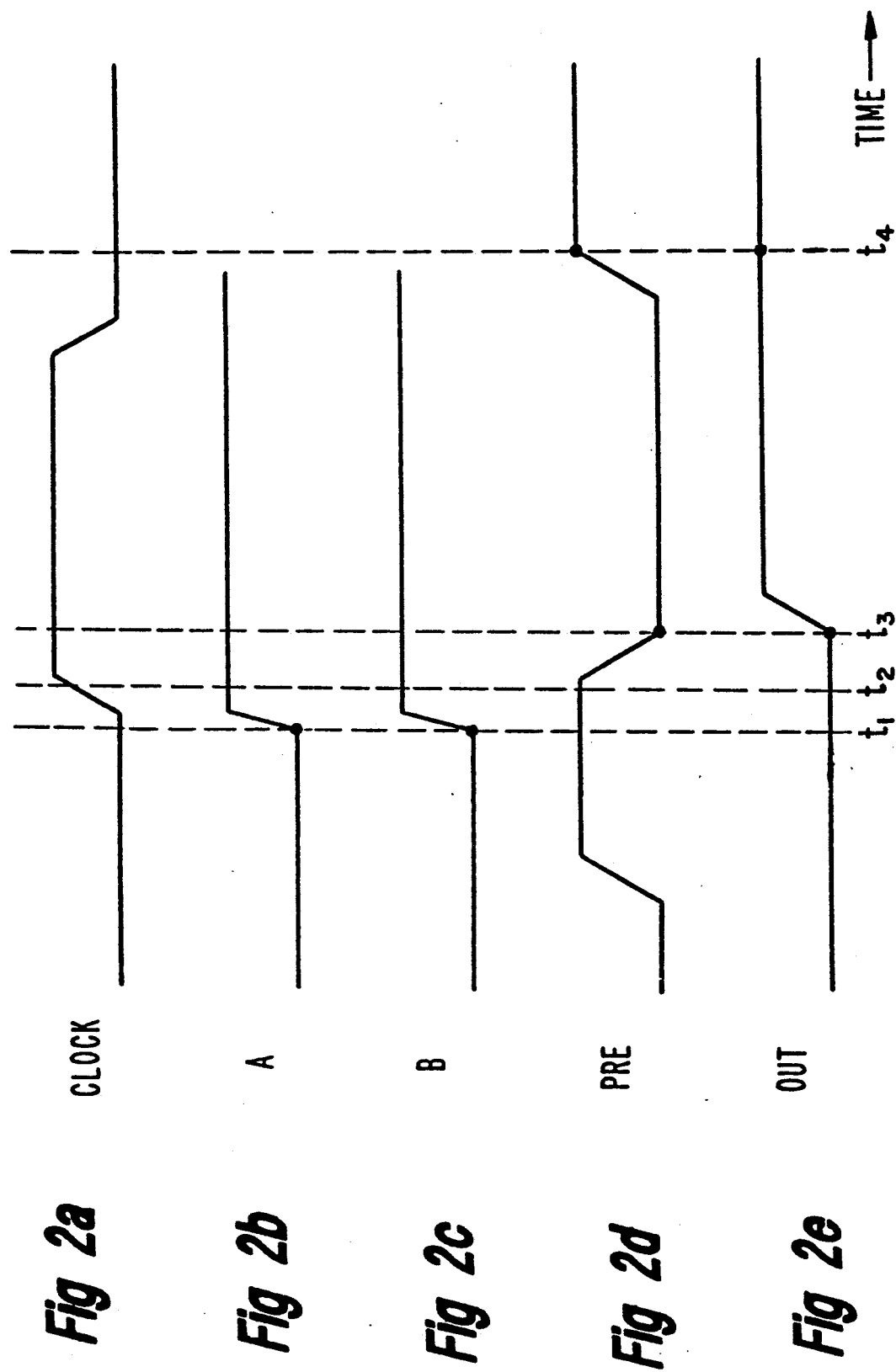

HASHING OUTPUT EXCLUSIVE-OR DRIVER WITH PRECHARGE

BACKGROUND OF THE INVENTION

1. Field of the Invention

The present invention relates to a hashing output driver which allows for very short setup times of the inputs and a very fast evaluation of the hashing function.

2. Description of the Prior Art

A hashing output driver is useful in a variety of circuit applications. For example, in prior art virtual memory systems in multi-user environments, two address portions are sometimes used to locate data stored in physical memory so as to reduce the miss rate. In particular, a space identifier and a virtual page number are together used to identify the location in physical memory at which particular data is stored. The space identifier identifies a space in virtual memory which is unique to each user process and is determined by the operating system, while the virtual page number identifies a particular page of a paged virtual memory. The space identifier and virtual page number can be hashed together (i.e., the exclusive OR of their values in digital form is taken), and the result is the physical address used for accessing the data stored in the physical memory. Accordingly, such systems use a hashing address driver which drives the hashed signals to the output.

Such a technique prevents all users who desire the same common page from mapping into the exact same physical location by distributing the common page throughout the memory in accordance with the different space identifiers. In other words, a virtual page which is used frequently is distributed throughout the memory or cache and is made accessible to all users of the system by granting everyone a different space identifier for mapping that page into different segments of virtual memory. As a result, the common page may be swapped into different locations in memory or cache for each process. Such a technique provides for more efficient use of the segmented memory cache by limiting the number of cache misses.

However, such a technique typically adversely affects the performance of the system because the hashing function of the hashing output driver typically takes a while to evaluate. Generally, the hashing function is implemented as an exclusive OR gate which receives the space identifier and the virtual page number at inputs thereof and outputs driving signals to a separate output driver for driving the addresses to the address bus of the virtual memory system. Although such a system is typically quite effective, the efficiency of the exclusive OR gate is limited by late arriving address inputs and by slow evaluation of the hashing function by the exclusive OR gate.

Accordingly, a hashing output driver is desired for use in such a system so as to improve performance despite late arriving inputs by increasing the speed of the evaluation of the hashing function. Preferably, the hashing function will be integrated into the output driver so as to increase performance and facilitate manufacture. The present invention has been designed to meet these needs.

SUMMARY OF THE INVENTION

The present invention relates to a hashing output driver which has a high drive output for driving large capacitive loads. The hashing output driver of the invention integrates the hashing function (exclusive OR) into the output driver and provides for precharging to shorten the setup time of the inputs and to allow for very fast evaluation of the hashing function.

Such a circuit in accordance with the invention preferably drives an output driver in accordance with an exclusive OR determination of first and second input signals to the output driver. In particular, such a circuit in accordance with the invention comprises clocking means for providing a clocking signal and means responsive to the first and second input signals for making an exclusive OR determination of the first and second input signals and driving the result of the exclusive OR determination to the output when the clocking signal is in a predetermined state. Also, in order to minimize setup time of the first and second input signals before the clocking signal reaches the predetermined state, the invention also comprises precharging means for precharging the exclusive OR determination means before arrival of the first and second input signals when the clocking signal is in a state other than the afore-mentioned predetermined state.

In accordance with a preferred embodiment of the invention, the exclusive OR determination means comprises a first pair of series connected FETs responsive to the first and second input signals and a second pair of series connected FETs which is responsive to the complements of the first and second input signals. The exclusive OR determination means so designed functions as a "pull down" circuit for the output of the output driver, whereby the output can only be pulled low when the input signals in a discharge path have the same logic value. In accordance with such an embodiment, the precharging means preferably comprises an FET for precharging the exclusive OR determination means before arrival of the first and second input signals when the clocking signal is in the state other than the aforementioned predetermined state. In addition, such an FET preferably has a relatively small conductance so that the discharge path through the exclusive OR determination means can overcome it when both input signals to the FETs of the discharge path are of equal value. The precharging FET preferably also has a small current capability and is disposed so as to compensate leakage currents of the output driver.

As disclosed herein, such an output driver is preferably used to provide a hashing function for an address driver, although those skilled in the art will readily appreciate that the hashing output driver may be used in many different circuit configurations.

BRIEF DESCRIPTION OF THE DRAWINGS

The above and other objects and advantages of the invention will become more apparent and more readily appreciated from the following detailed description of the presently preferred exemplary embodiment of the invention taken in conjunction with the accompanying drawings, of which:

FIGS. 2(a)–(e) illustrate timing diagrams for explaining the operation of the circuit of FIG. 1.

DETAILED DESCRIPTION OF THE PRESENTLY PREFERRED EMBODIMENT

Figure 1:
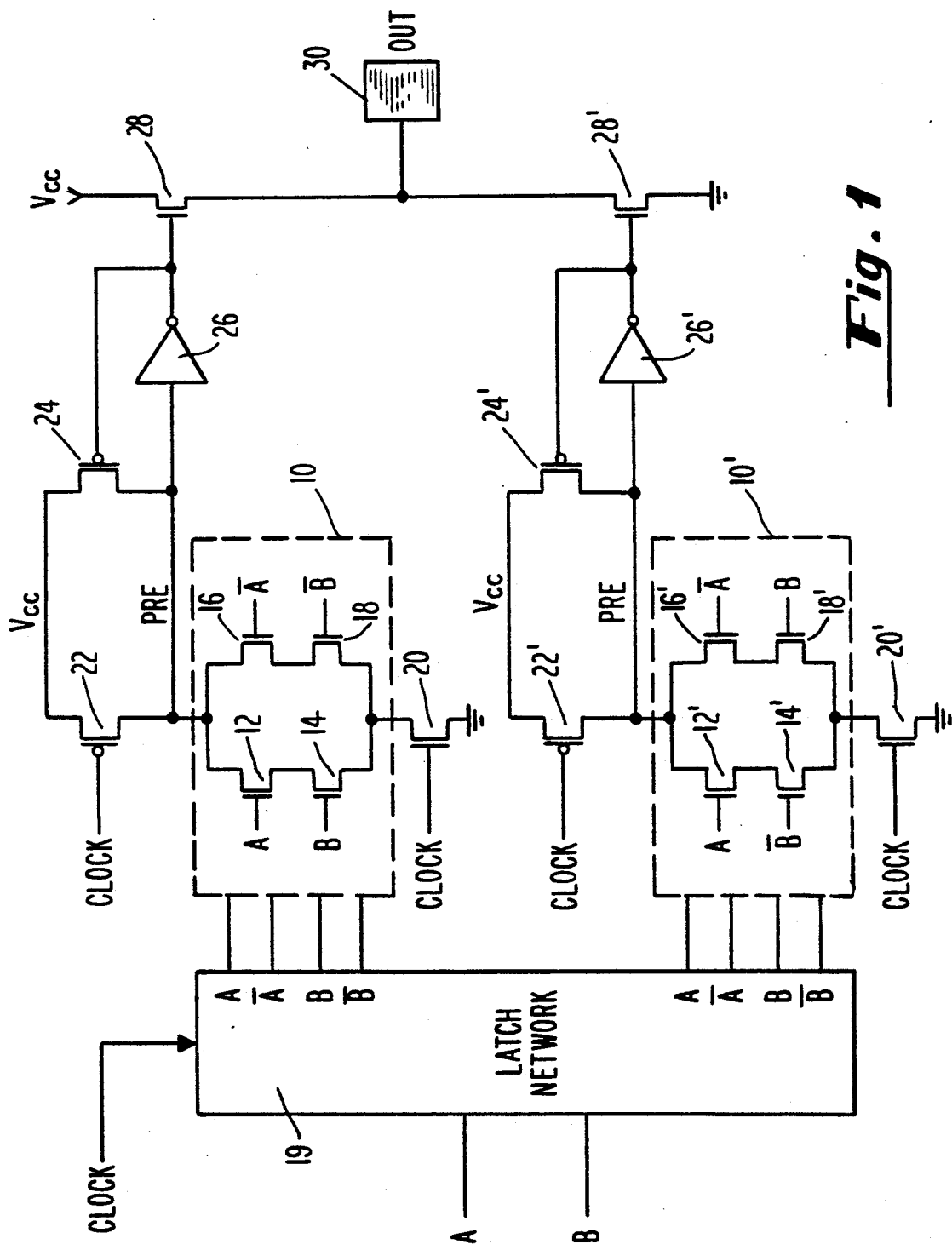
FIG. 1 illustrates a simplified circuit diagram of a preferred embodiment of a hashing output driver in accordance with the invention.

A preferred embodiment of the invention will now be described with reference to FIGS. 1 and 2. It will be appreciated by those of ordinary skill in the art that the description given herein with respect to those figures is for exemplary purposes only and is not intended in any way to limit the scope of the invention All questions regarding the scope of the invention may be resolved by referring to the appended claims.

FIG. 1 illustrates a preferred embodiment of a circuit which performs a hashing function and has a high drive output for driving large capacitive loads in accordance with the invention. As will be described below, the circuit of FIG. 1 integrates the hashing (exclusive OR) function into an output driver by using pull-down networks 10 and 10' responsive to the inputs to be hashed by the output driver. Pull-down networks 10 and 10' are connected in parallel and driven in opposing phases so as to provide an output when the clocking signal indicates an output driving phase. Since pull-down network 10' is structured the same as pull-down network 10 (except for different inputs), only pull-down network 10 will be described in detail herein. Those skilled in the art will appreciate that pull-down network 10' operates on the same principles as pull-down network 10.

As shown, the pull-down network 10 of the invention is comprised of FETs 12, 14, 16 and 18 which are connected to create separate discharge paths which are responsive to the respective inputs A and B (and their complements) from a latch network 19. During operation, the discharge path through FETs 12 and 14 is activated when inputs A=B=1, while the discharge path through FETs 16 and 18 is activated when inputs A=B=0. Similarly, the discharge path through FETS 12' and 14' is activated when A=invB=1, while the discharge path through FETs 16' and 18' is activated when invA=B=1. As would be apparent to one skilled in the art, no pull-down function is provided by pull-down network 10 when input A does not equal input B. This function is instead provided by pull-down network 10', which provides the pull-down function when A does not equal B. Accordingly, the pull-down networks 10 and 10' are complementary so that the output driver is driven in response to a discharge through only one of the discharge paths of pull-down networks 10 and 10'.

Clocking signal CLOCK is received at FETs 20 and 22 in the circuit of FIG. 1 as shown. By placing FET 20 in series with the pull-down network 10, the discharge through pull-down network 10 can only occur when CLOCK is high. Similarly, by placing FET 22 between node PRE and the power supply voltage VCC, the node PRE can only charge when CLOCK is low. As a result, precharging FET 24 only charges the node PRE when CLOCK is low. Hence, by having the inputs A and B arrive before CLOCK goes high, the pull-down network 10 will be ready for the exclusive OR determination as soon as CLOCK goes high. Such a design thereby accelerates the setup of the inputs A and B and hence the evaluation of the exclusive OR function. The result of the exclusive OR determination is then rapidly output through inverter gate 26 to driving FET 28 for application to an output (e.g., address) pad 30. Accordingly, such a circuit design allows very short setup time for the inputs A and B and a very fast evaluation of the hashing function with the resultant improvement in system performance.

The operation of the circuit of FIG. 1 will now be described with reference to FIG. 2.

Generally, inputs A and B and their logical complements are received from latch network 19 and then driven by the circuit of the invention to some output device. In accordance with a preferred embodiment, it will be assumed that A and B are addresses (such as the space identifier and virtual page number) which are received from a latch network 19 and which are to be hashed together in accordance with the invention. The result is then used to drive the address lines to a memory cache as discussed in the background portion of the specification.

As described above, the hashing function is accomplished in accordance with the invention by first precharging the node PRE when CLOCK is low as shown in FIGS. 2(a) and (d). Node PRE is held high by FET 22 and FET 24, the latter of which is used to avoid leakage and coupling errors. The input signals A and B then arrive at time $t_1$ while CLOCK is still low as shown in FIGS. 2(b) and (c). If A equals B (for pull-down network 10) or A does not equal B (for pull-down network 10'), a discharge path is formed between FET 24 and FET 20, but since the node PRE is already charged, inputs A and B are setup before CLOCK changes to a high state. When CLOCK goes high, the node PRE is evaluated at time $t_2$ as shown in FIG. 2(d). The node PRE then discharges through the appropriate discharge path so that node PRE goes low. In the arrangement of FIG. 1, only one discharge path may discharge at a time. As a result of this discharge, the output of inverter 26 goes high and the output signal OUT is driven high at time $t_3$ and remains high until the next rising edge of CLOCK as shown in FIG. 2(e). For this purpose, driving FET 28 is sufficiently large to drive over a latching inverter connected to pad 30 for holding the value of OUT at pad 30 while CLOCK is low. Then, when CLOCK goes low, PRE recharges and OUT maintains its value for all inputs at time $t_4$ as shown in FIG. 2(e). Driving FETs 28 and 28' then turn off, and the value at pad 30 from when CLOCK was high is maintained by the aforementioned latching inverter. The cycle then repeats and A and B are again evaluated.

In the embodiment of FIG. 1, FET 24 charges to hold the node PRE to a high value when the output of inverters 26 or 26' are low and preferably has a small conductance value so that node PRE can be pulled low through the appropriate discharge path when CLOCK is high. CLOCK is preferably low long enough that node PRE can be precharged to a high level and is high long enough to evaluate the exclusive OR function and to discharge PRE. Also, as noted above, input signals A and B must arrive before CLOCK goes high as shown in FIGS. 2(a)–(c). In other words, input signals A and B are only allowed to arrive when CLOCK is low and hence node PRE is precharging. Since the exclusive OR function of the invention can be implemented without the need for a gate to drive the output driver, the resulting circuit changes state much quicker than in the prior art. Also, since the output is only changed in accordance with the present invention when the precharged node PRE is discharged, the exclusive OR function may be evaluated very rapidly and output to the driver. Accordingly, as desired, the invention provides a hashing output driver with very short setup times for the inputs and a very fast evaluation of the hashing function so as to provide improved performance.

Those skilled in the art will readily appreciate that many modifications to the invention are possible within the scope of the invention. For example, the pull-down network 10 of the invention can be modified to perform a single buffer drive function wherein A is provided directly to the output by setting input B equal to logic level 1. Accordingly, the scope of the invention is not intended to be limited by the preferred embodiments described above, but only by the appended claims.

I claim:

1. A circuit for driving an output in accordance with first and second input signals, comprising:

clocking means for providing a clocking signal;

means responsive to said first and second input signals for making an exclusive OR determination of said first and second input signals;

means for driving the result of said exclusive OR determination to said output when said clocking signal is in a predetermined state; and an FET responsive to an output of said driving means for precharging said exclusive OR determination means in accordance with said output of said driving means before arrival of said first and second input signals when said clocking signal is in a state other than said predetermined state.

2. A circuit as in claim 1, wherein said exclusive OR determination means comprises a first pair of series connected FETs responsive to said first and second input signals and a second pair of series connected FETs which is responsive to the complements of said first and second input signals.

* * * * *